(12) United States Patent
Woody et al.

(10) Patent No.: US 7,952,875 B2
(45) Date of Patent: May 31, 2011

(54) STACKED BUSBAR ASSEMBLY WITH INTEGRATED COOLING

(75) Inventors: George R. Woody, Redondo Beach, CA (US); Terence G. Ward, Redondo Beach, CA (US); Edward P. Yankoski, Corona, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 133 days.

(21) Appl. No.: 12/475,005

(22) Filed: May 29, 2009

(65) Prior Publication Data

US 2010/0302733 A1 Dec. 2, 2010

(51) Int. Cl.
*H05K 7/20* (2006.01)
(52) U.S. Cl. .................................. 361/699; 361/775
(58) Field of Classification Search .............. 361/775
See application file for complete search history.

(56) References Cited

U.S. PATENT DOCUMENTS

| | | | | |
|---|---|---|---|---|
| 3,007,088 | A * | 10/1961 | Diebold | 257/718 |
| 4,894,709 | A * | 1/1990 | Phillips et al. | 257/714 |
| 4,956,746 | A * | 9/1990 | Gates et al. | 361/699 |
| 5,111,280 | A * | 5/1992 | Iversen | 257/713 |
| 5,214,564 | A * | 5/1993 | Metzler et al. | 361/699 |
| 5,579,217 | A * | 11/1996 | Deam et al. | 363/144 |
| 5,655,290 | A * | 8/1997 | Moresco et al. | 29/830 |
| 5,804,761 | A * | 9/1998 | Donegan et al. | 174/15.1 |
| 5,940,263 | A * | 8/1999 | Jakoubovitch | 361/328 |
| 6,574,094 | B1 * | 6/2003 | Morrow et al. | 361/676 |
| 6,885,553 | B2 * | 4/2005 | Pfeifer et al. | 361/688 |
| 7,835,151 | B2 * | 11/2010 | Olesen | 361/689 |

* cited by examiner

*Primary Examiner* — Gregory D Thompson
(74) *Attorney, Agent, or Firm* — Ingrassia Fisher & Lorenz, P.C.

(57) ABSTRACT

A stacked busbar assembly includes two or more busbar subassemblies, each including a plurality of busbars having one or more power semiconductor devices bonded thereto (e.g., IGBTs, power diodes, and the like). Each busbar has an internal integrated cooling system including one or more fluid channels in communication with an inlet and an outlet. The busbar assemblies are stacked such that their respective inlets and outlets are aligned and a coolant may then flow in parallel therethrough.

15 Claims, 6 Drawing Sheets

SECTION A-A

US 7,952,875 B2

STACKED BUSBAR ASSEMBLY WITH INTEGRATED COOLING

TECHNICAL FIELD

The present invention generally relates to semiconductor devices, and more particularly relates to heat management in power semiconductor components that incorporate one or more busbars.

BACKGROUND

High-end motor systems such as those used in hybrid vehicles are often controlled using one or more high power modules. A traction drive system, for example, consists of a drive unit (motor and gearbox) and an inverter for controlling the motor. The inverter and drive unit are typically located in a separate chassis.

The inverter generally includes an IGBT (Insulated Gate Bipolar Transistor) and a large silicon diode. These power components are mounted (e.g., soldered) on DBC (Direct Bond Copper) substrates, which comprise copper layers with an insulating ceramic layer sandwiched in between. Wire bonds or other interconnects are used to provide electrical connectivity between a busbar (typically a thick bar of copper) and the various die, where the busbar provides electrical communication with external systems.

It is desirable to reduce the complexity, mass, and volume of such electronic components while improving their heat transfer characteristics. Typically, known busbar assemblies typically utilize large heat sinks or air-cooled units, thus resulting in additional components, increased cost, and additional required space.

Accordingly, there is a need for improved heat transfer methods in power devices such as those used in connection with motor control inverters. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description. The invention may be described herein in terms of functional and/or logical block components and various processing steps. It should be appreciated that such block components may be realized by any number of hardware, software, and/or firmware components configured to perform the specified functions. For the purposes of conciseness, conventional techniques and systems related to semiconductor processing, transistor theory, packaging, and power modules are not described in detail herein.

In general, the present invention relates to a stacked busbar assembly includes one or more busbar subassemblies, each including a plurality of busbars having one or more power semiconductor devices bonded thereto (e.g., IGBTs, power diodes, and the like). Each busbar has an internal integrated cooling system including one or more fluid channels in communication with an inlet and an outlet. The busbar assemblies are stacked such that their respective inlets and outlets are aligned and coolant may then flow in parallel therethrough. Power devices integrated in this way provide improved heat dissipation, thereby reducing the cost, mass, and volume of the resulting power component.

As a threshold manner, the nature of such busbar assemblies and subassemblies will now be described. As mentioned above, an inverter used in connection with a motor typically includes one or more IGBTs (Insulated Gate Bipolar Transistors) coupled to corresponding diodes (e.g., silicon diodes). These components are typically mounted (e.g., soldered) on DBC (Direct Bond Copper) substrates, where the opposite side of the DBC acts as the interface to a heat sink. The die and diode side are interconnected (via wires or the like) to the bus bar connections.

In accordance with the busbars of present invention, however, the power die itself (e.g., an IGBT die) and diode are directly mounted to the busbars, and the two components are suitably connected. The busbars act as heat sinks, and may themselves be cooled using micro channels, micropin fins, direct cooling, or any other heat transfer method, as will be shown in greater detail below. The invention can also be used with other devices other than IGBT's such as WBG (Wide Band Gap) devices such as VJFET (Vertical Junction Field Effect Transistors) made from silicon carbide (SiC) or HFET (Horizontal Field Effect Transistors) such as gallium nitride (GaN).

Figure 1:
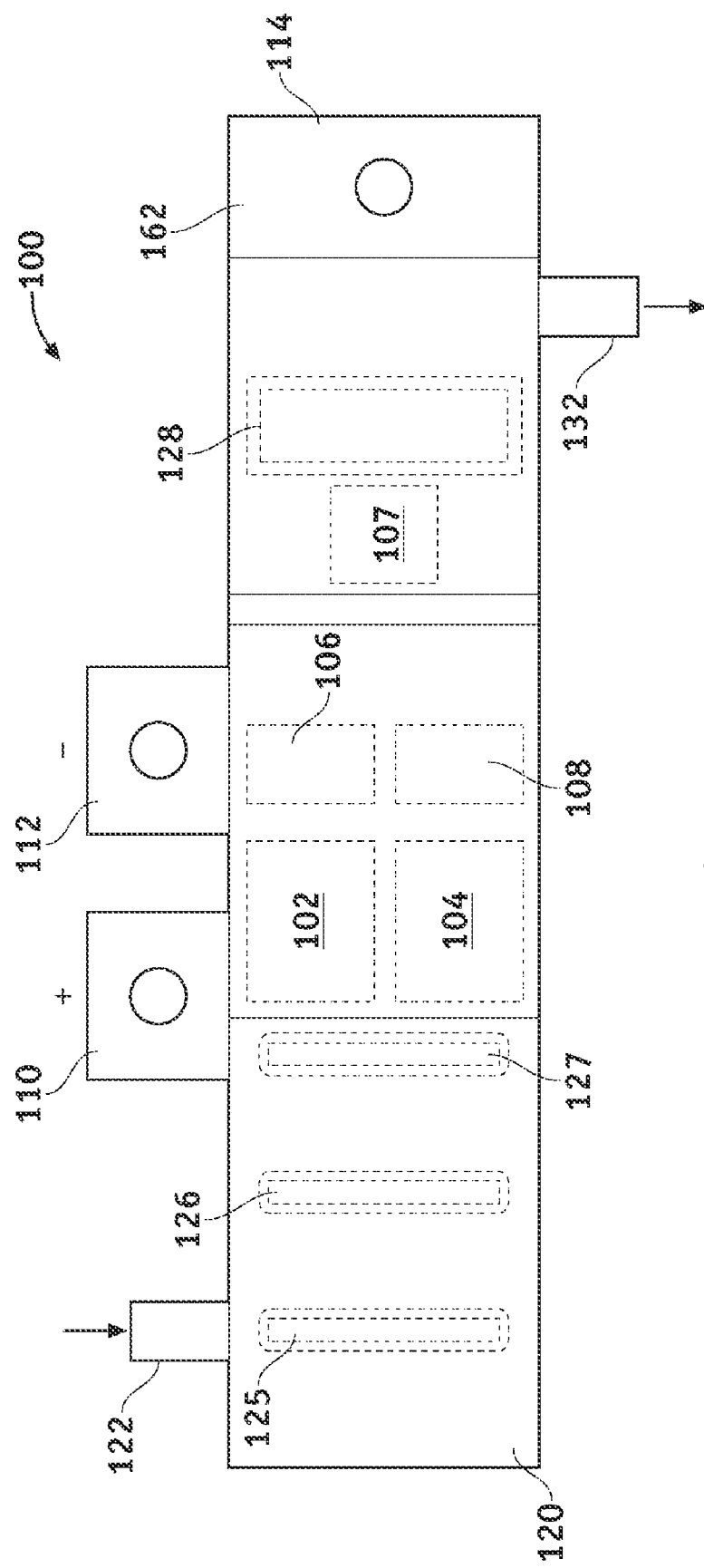
FIG. 1 is a simplified overview of a busbar assembly in accordance with one embodiment of the present invention.

FIG. 1 is a simplified plan view of an exemplary busbar assembly 100 in accordance with one embodiment of the invention. As shown, assembly 100 includes a plurality of busbars having a positive terminal 110 and a negative terminal 112 each protruding outward and configured to electrically communicate with external components in the traditional manner. Similarly, busbar 162 has an output node 114 configured for electrical coupling to an AC device such as a drive motor.

Two manifolds, 120 and 130, are coupled to opposite ends of assembly 100. Manifold 120 is in fluid communication with an inlet 122, and manifold 130 is in fluid communication with outlet 132. Manifold 120 is configured to receive coolant from a pressurized stream, and manifold 130 is in fluid communication with, for example, a downstream heat exchanger configured to remove heat from effluent coolant.

Various semiconductor die components, such as IGBTs 102 and 104, diodes 106 and 108, a gate driver 107 are directly connected to the various busbars as described in further detail below.

During operation, the busbars transfer current received from the positive and negative nodes 110 and 112 of a DC source to each power diode and/or IGBT device connected thereto, thereby generating a single-phase AC signal that is transferred through busbar 162 to, for example, a vehicular AC system. Busbar assembly 100 is actively cooled by a coolant that flows from first manifold 120, through coolant channels (illustrated below) of at least one busbar, and exits through second manifold 130 where it may flow to a heat exchanger for cooling and recycling to busbar assembly 100. As shown in partial cutaway, various ports—e.g., ports 125, 126, 127, and 128—are formed in the busbars to facilitate the transfer of fluid therethrough.

Figure 2:
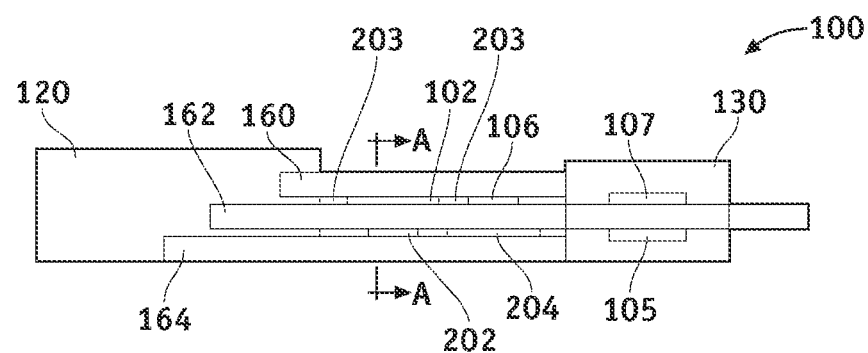
FIG. 2 is a cross-sectional side view of the busbar assembly of FIG. 1.

More particularly, referring to FIG. 2, busbar assembly 120 includes a positive DC busbar 160, a negative DC busbar 164, an AC busbar 162, and any number of power devices such as IGBTs and/or power diodes (102, 106, 202, and 204). In the illustrated embodiment, DC busbar 160 is coupled to a first IGBT 102 and a first power diode 106 mounted thereon, and is coupled to the positive node of a DC source such as a battery or fuel cell (not shown). Similarly, negative DC busbar 164 is coupled to a second IGBT 204 and a second power diode 202, and is coupled to the negative node of a DC source (not shown). Each of these power devices has a first side directly mounted to a respective busbar surface using solder or the like in any conventional manner.

Electrical connection between power devices and AC busbar 162 is made using wire bonding, direct soldering, or any other method. During operation, these power devices in combination transform DC signals received through positive and negative busbars 160 and 164 to a single-phase AC output signal transferred through AC busbar 162 to an AC system such as a drive motor.

In one embodiment, each busbar 160, 162, and 164 is composed of copper or a copper alloy, and is electrically interconnected with an adjacent busbar only through the power devices described above. All or part of each busbar may be plated—e.g., nickel or tin plating known in the art.

An insulating material such as an epoxy may be injected into the gaps 203 between busbars 160, 162, and 164 to encapsulate the power devices and provide electrical and environmental isolation.

Figure 3:
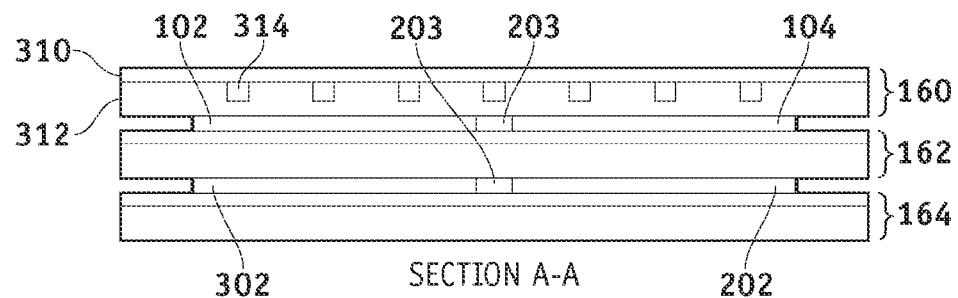
FIG. 3 is a cross-sectional view of a particular section designated in FIG. 2.

FIG. 3 is a cross-sectional view of busbar assembly 100 taken along section A-A in FIG. 2. As shown, busbar assembly 100 includes DC busbars 160 and 164 arranged in a single stack with busbar 162 interposed therebetween. IGBT power die 102, 202, 104, and 302 are mounted therebetween to achieve the desired electrical functionality. Mounting of semiconductor devices to busbars may be done by soldering or the like in any conventional manner.

In one embodiment, at least one of busbars 160, 162, and/or 164 has a plurality of continuous channels through which a dielectric coolant liquid may flow, each channel having a first end and a second end in fluid communication with first and second manifolds 120 and 130 (FIG. 2), respectively. Channels may be formed integrally into each busbar, or may be formed by bonding a sealing plate to a body having a plurality of grooves formed in a surface. For example, as shown in FIG. 3, DC busbar 100 may include sealing plates 310 placed on an upper surface of body 312 and bonded thereto (using solder for example) forming a first plurality of channels 314. In either case, channels 314 each have an inlet and an outlet in fluid communication with first manifold 120 and second manifold 130 (FIG. 2), respectively.

First manifold 120 provides a supply of pressurized coolant that flows through the channels 314 of each busbar to provide cooling thereto. Coolant flowing through the channels absorbs heat generated within busbar assembly 100 and exits into second manifold 130 in a heated state where it may be directed to a downstream heat exchanger for cooling and subsequent recycling back to first manifold 120.

Accordingly, the present busbar assembly eliminates many of the typical IGBT interface elements. The compact, vertically stacked configuration of this assembly can be used to make a smaller Power Electronics Bay (PEB) or inverter chassis for maximum integration in a motor. Device mounting to various busbars is preferably done in a manner to reduce stray inductance to a minimum, which helps with high switching frequencies and reduced ripple. This in turn helps to reduce size of other components such as capacitors and inductors.

Figure 4:
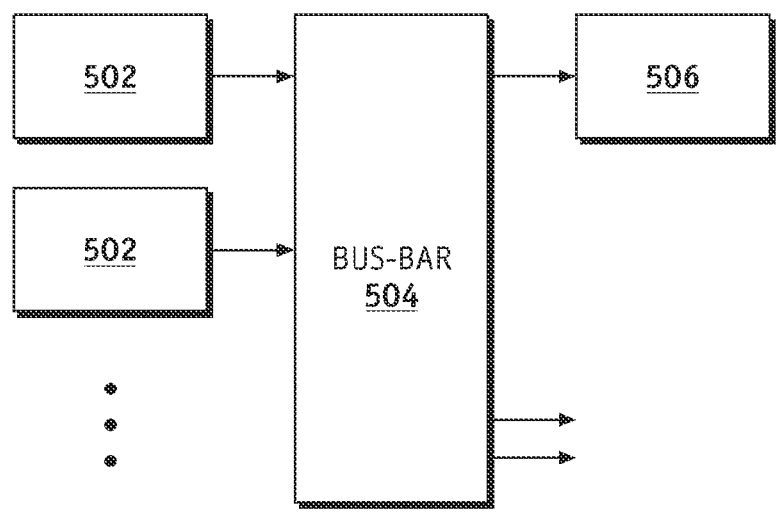
FIG. 4 is a conceptual heat-transfer diagram associated with the present invention.

In general, a number of integrated cooling systems may be used in accordance with the present invention. FIG. 4 is a conceptual block diagram depicting heat flow in the system. As shown, heat from power dice 502 is conducted to busbar 504. The heat transferred to busbar 504 is then suitably dissipated to the environment in any convenient manner—e.g., via conduction, convection (forced or free), and/or radiation. In one embodiment, for example, a thermal subsystem 506 is used to increase heat dissipation. Such a subsystem 506 may include direct cooling, micropin fins, micro channels, phase-change, or any other heat transfer system now known or later developed.

Figure 5:
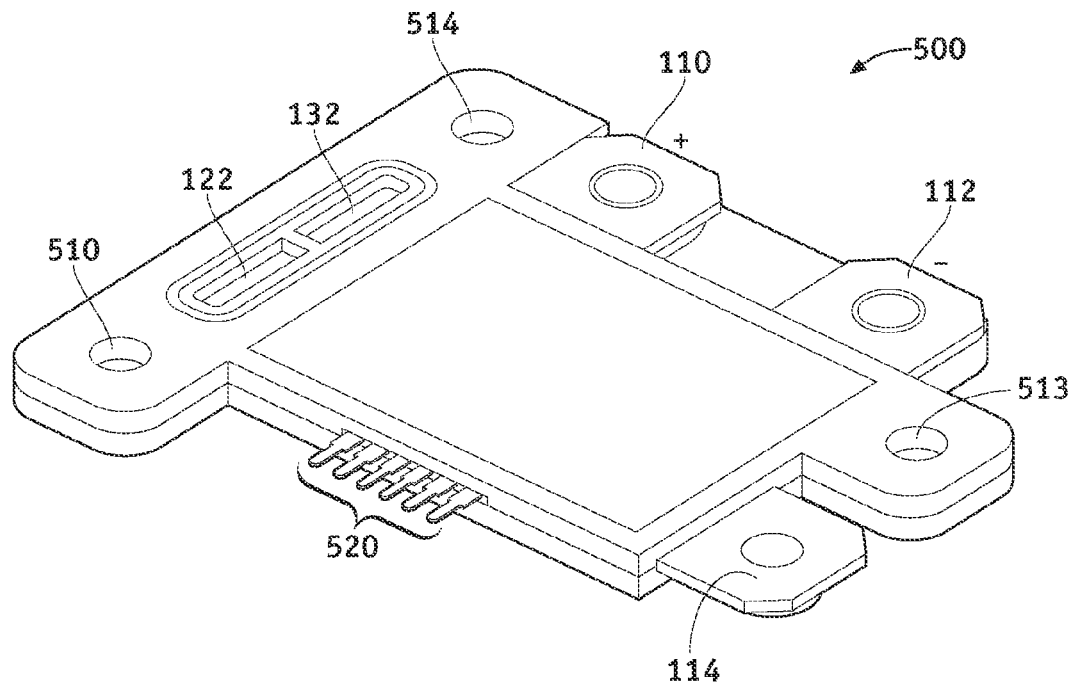
FIG. 5 is an isometric overview of a busbar subassembly in accordance with an alternate embodiment.
Figure 6:
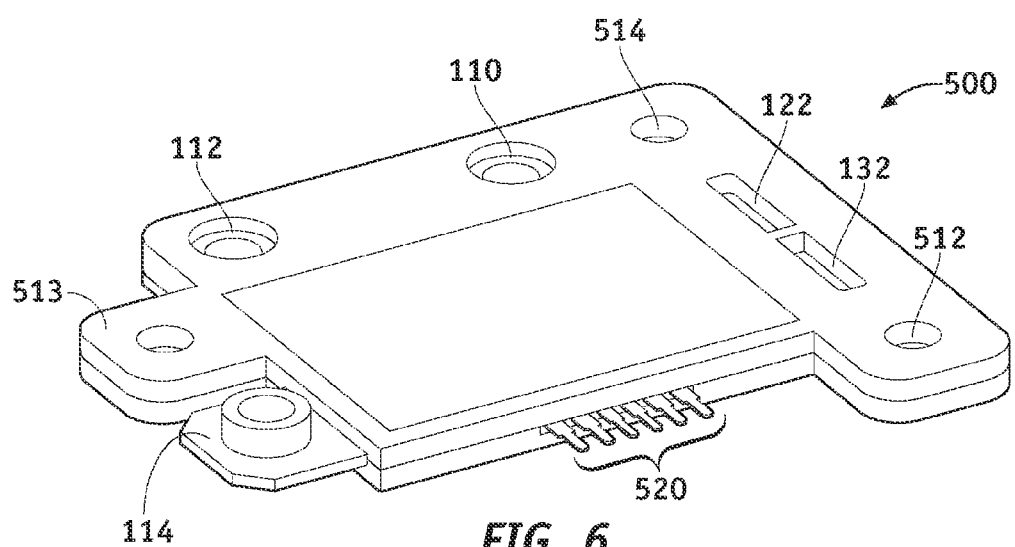
FIG. 6 is an alternate view of the busbar subassembly shown in FIG. 5.

Referring now to FIGS. 5-8, a stacked busbar assembly will now be described. As shown in FIGS. 5 and 6, a busbar subassembly 500 includes, as described above, a positive DC terminal 110, a negative DC terminal 112, and an AC terminal 114. Each subassembly 500 also includes an inlet 122 and outlet 132. One or more channels are provided within the body of subassembly 500 for accepting a flowing coolant, also as described above. In the illustrated embodiment, each subassembly 500 includes appropriate mounting means, e.g., mounting holes 510, 514, and 513, positioned at various points along its perimeter. A plurality of leads or terminals 520 extend from subassembly 500 and allow electrical connectivity to the various power components enclosed therein.

Figure 7:
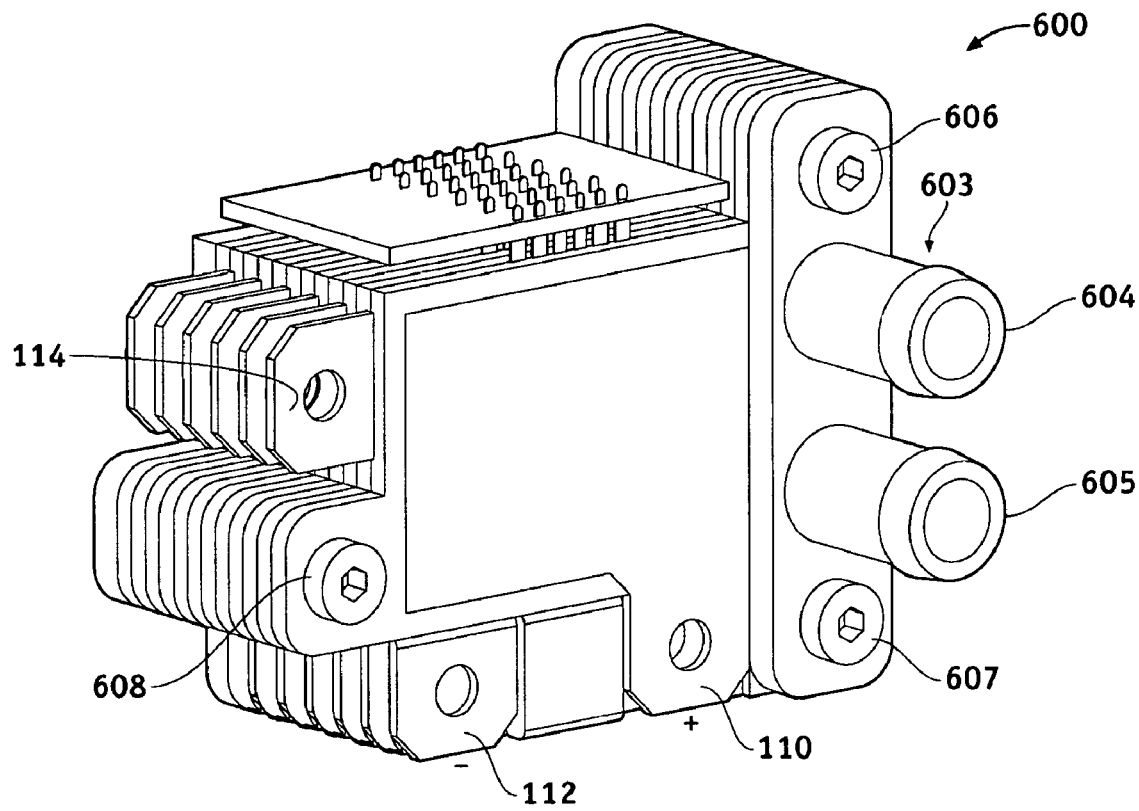
FIG. 7 is an example stacked busbar assembly.
Figure 8:
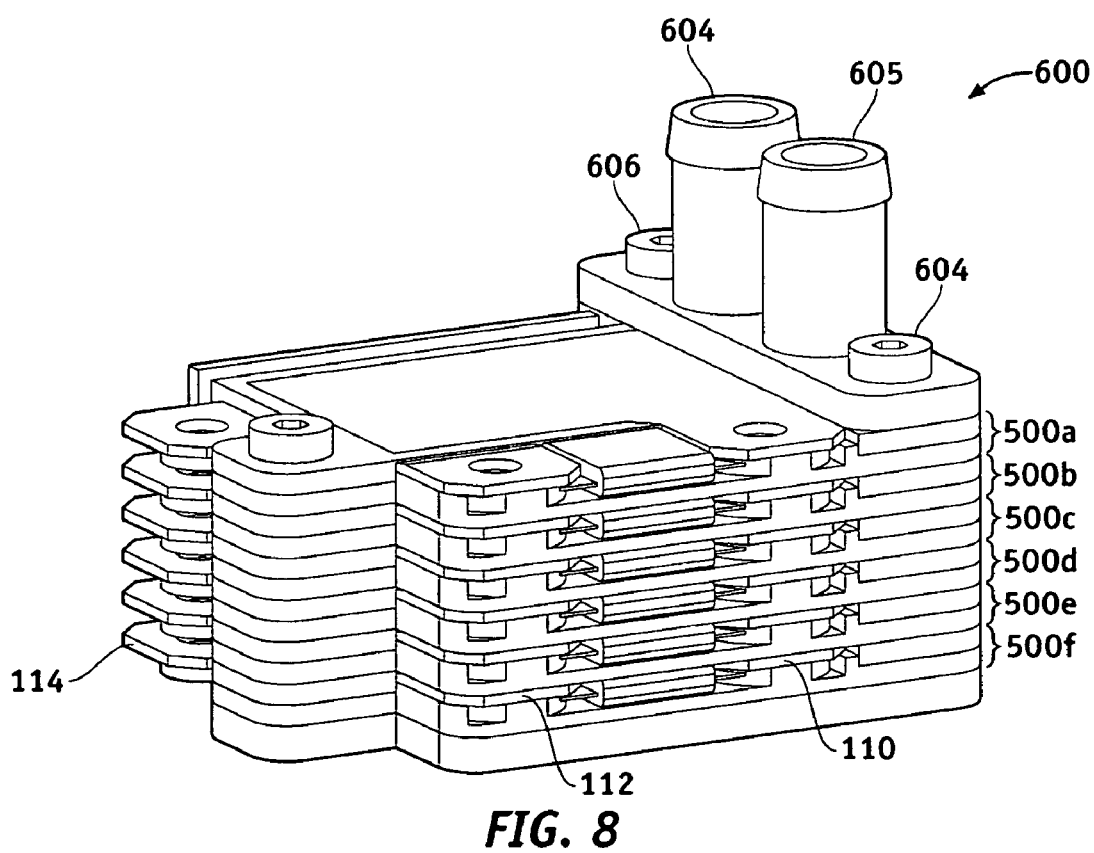
FIG. 8 is an alternate view of the assembly of FIG. 7.

Each subassembly 500 has two generally flat surfaces on opposite sides—e.g., surfaces 510 and 513. This allows multiple modules to be "stacked" parallel to each other with their inlets 122 and outlets 132 aligned. Such an embodiment is shown in FIGS. 7 and 8. One or more O-rings or other sealant components may also be provided.

A control card 602 or other electronics may be conveniently coupled to leads 520, which are also aligned as shown. Control card 602 includes any number components capable of controlling the various IGBTs, diodes, and other components within each subassembly 500.

As illustrated, stacked busbar assembly 600 includes a plurality (in this embodiment six) busbar subassemblies 500 stacked as shown (subassemblies 500A-F). Their respective DC terminals (110, 112) and AC terminal (114) are also aligned for ease of connection. Assembly 600 may be single phase or multi-phase. Fastening mechanisms (e.g., bolts or screws 606, 607, and 608) are provided within corresponding mounting holes (510, 514, and 513) to hold the subassemblies 500 tightly together and prevent the leakage of coolant between respective inlets and outlets.

A header 603 is also coupled to the plurality of subassemblies 500 such that an inlet port 604 and outlet port 605 are aligned with the inlets 122 and outlets 132, respectively. Ports 604 and 605 are configured to connect to any suitable coolant source. In one embodiment, a water-based, low-conductivity coolant is used, such as a 5%/omix of ethylene glycol and water, with a flow rate of approximately 0.5-5.0 liters per minute.

Figure 9:
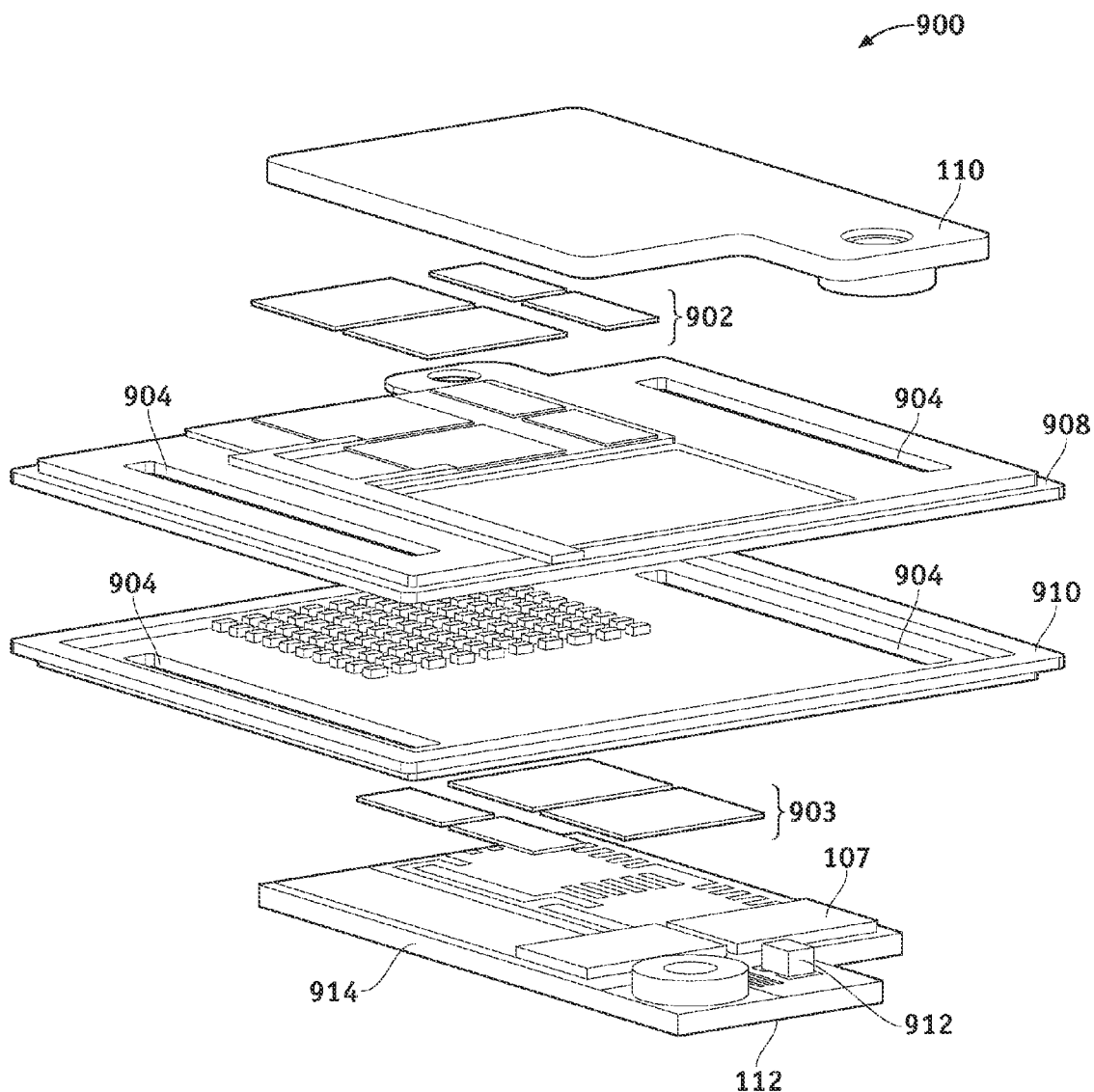
FIG. 9 is an exploded view of a busbar subassembly in accordance with one embodiment.

FIG. 9 depicts an exploded view of a busbar subassembly 900 in accordance with a particular embodiment of the invention. As shown, the layers comprise, in order from top to bottom, positive bus bar 110, various semiconductor die 902 (e.g., IGBTs, diodes, as described above), heatsink 908 having coolant input/outputs 904 and mating with heatsink 910. Another layer of semiconductor devices 903, and a negative bus bar 112 having a gate driver circuit 107, chip capacitor 912, and integrated metal substrate (IMS) provided thereon.

Figure 10:
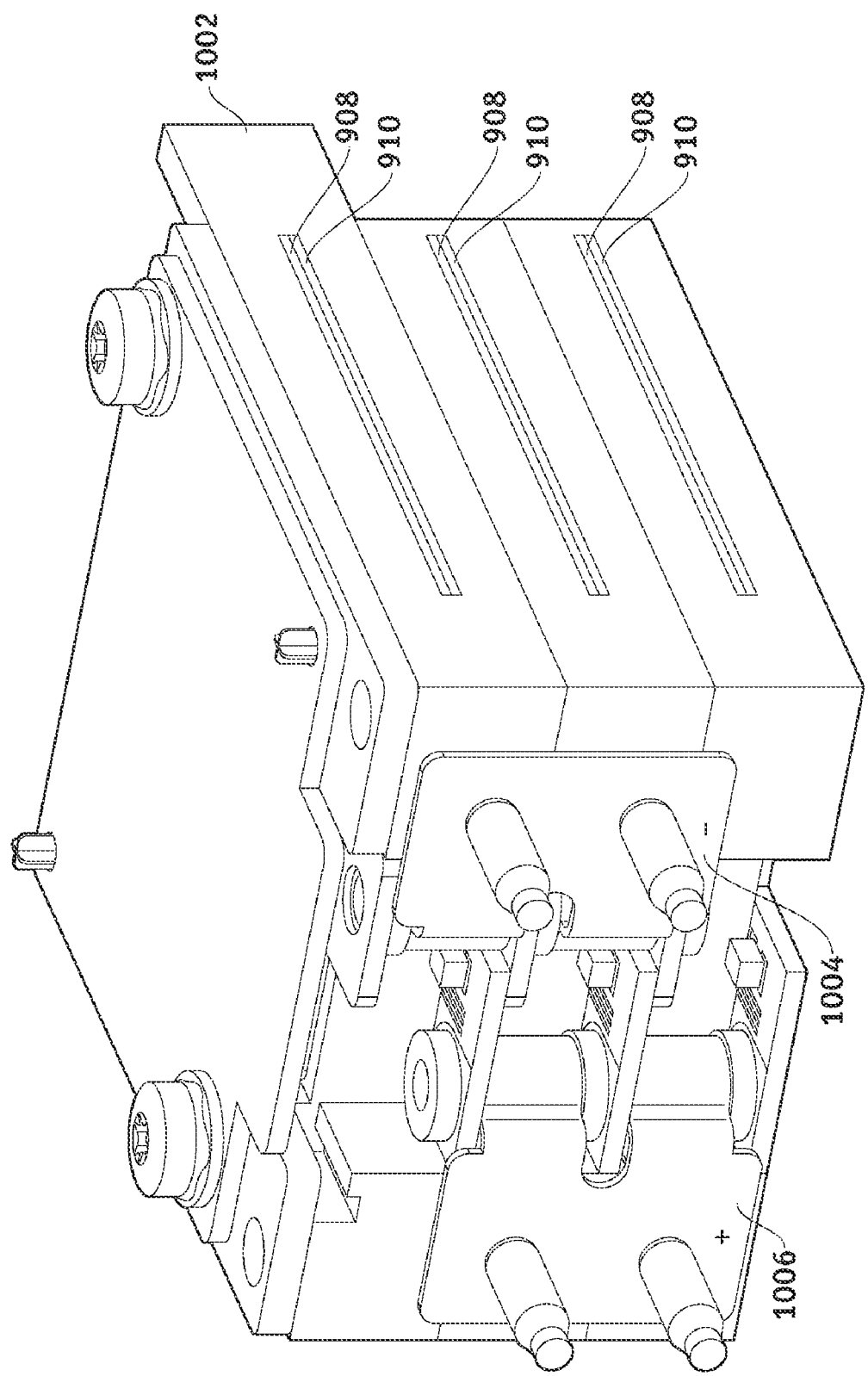
FIG. 10 is an isometric view of a stacked busbar in accordance with one embodiment.

A plurality of busbar assemblies 900 as shown in FIG. 9 may then be assembled as shown in FIG. 10. As illustrated, each pair of heatsinks 908, 910 are soldered, brazed together, or by any other method held within respective plastic housings 1002. Positive bus 1004 and negative bus 1006 are provided for connecting, respectively, to the positive and negative busbar terminals 110 and 112 of each subassembly.

It will be apparent that the resulting assemblies described above are compact and highly efficient from a heat-transfer standpoint. That is, compared to prior art modules, assemblies in accordance with the present invention exhibit low mass, low volume, low inductance, flexibility for scaling and inverter/motor integration, and may also reduce filter capacitance. It also conveniently allows connection to internal power components and external electrical connections. Furthermore, by configuring the inlets and outlets in a parallel fashion—i.e., such that the coolant flows in parallel through each subassembly 500—the resultant coolant pressure drop can be reduced.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention and the legal equivalents thereof.

What is claimed is:

1. A stacked busbar assembly comprising:
    a plurality of busbar subassemblies, each comprising a plurality of busbars having one or more power semiconductor devices bonded thereto, and an integrated cooling system including an inlet, an outlet, and one or more fluid channels in communication with the inlet and outlet; wherein the plurality of busbar assemblies are stacked such that their respective inlets and outlets are aligned; and wherein the plurality of busbars in each of the plurality of busbar subassemblies are electrically interconnected and include a first DC busbar, a second DC busbar, and an AC busbar provided therebetween;
    a first port coupled to the aligned inlets; and
    a second port coupled to the aligned outlets.

2. The stacked busbar assembly of claim 1, wherein the one or more fluid channels include one or more microchannels.

3. The stacked busbar assembly of claim 1, wherein the one or more power semiconductor devices includes at least one IGBT device and at least one diode electrically coupled thereto.

4. The stacked busbar assembly of claim 1, wherein each of the plurality of busbar assemblies includes a first DC terminal, a second DC terminal, and an AC terminal.

5. The stacked busbar assembly of claim 1, further comprising polymeric insulating layers between the one or more power semiconductor devices.

6. The stacked busbar assembly of claim 1, wherein the plurality of busbars comprise a copper alloy.

7. The stacked busbar assembly of claim 1, wherein the plurality of busbar assemblies each include an integrated metal substrate.

8. A vehicular inverter module comprising:
    a plurality of busbar subassemblies, each comprising a plurality of busbars having pairs of IGBT devices and power diodes bonded thereto, and an integrated cooling system including an inlet, an outlet, and one or more fluid channels in communication with the inlet and outlet;
    wherein the plurality of busbar assemblies are stacked such that their respective inlets and outlets are aligned such that a coolant flows in parallel through each of the plurality of busbars; and wherein the plurality of busbars in each of the plurality of busbar subassemblies are electrically interconnected and include a first DC busbar, a second DC busbar, and an AC busbar provided therebetween.

9. The vehicular inverter module of claim 8, wherein the one or more fluid channels include one or more microchannels.

10. The vehicular inverter module of claim 8, wherein each of the plurality of busbars includes a first DC terminal, a second DC terminal, and an AC terminal.

11. The vehicular inverter module of claim 8, further comprising polymeric insulating layers between the pairs of IGBT devices and the power diodes.

12. A method of cooling an inverter module having a plurality of power semiconductor devices mounted therein, the method comprising:
    providing a plurality of busbar subassemblies, each comprising a plurality of busbars having one or more pairs of IGBT devices and one or more power diodes bonded thereto, and an integrated cooling system including an inlet, an outlet, and one or more fluid channels in communication with the inlet and outlet, wherein the plurality of busbars in each of the plurality of busbar subassemblies are electrically interconnected and include a first DC busbar, a second DC busbar, and an AC busbar provided therebetween;
    stacking and securing the plurality of busbar subassemblies together such that their respective inlets and outlets are aligned;
    coupling a source of a coolant to the aligned inlets and aligned outputs; and
    cycling a coolant through the busbars such that the coolant flows in parallel through the busbars, and heat generated by the one or more pairs of IGBT devices and one or more power diodes is transferred thereto.

13. The method of claim 12, wherein providing the plurality of busbars includes providing busbars having a plurality of microfins incorporated within the one or more fluid channels.

14. The method of claim 12, wherein providing a plurality of busbars includes providing busbars having a plurality of microchannels incorporated within the one or more fluid channels.

15. The method of claim 12, wherein the coolant comprises a low-conductivity water-based coolant.

* * * * *